United States Patent [19]

Reichert et al.

[11] Patent Number: 5,176,743
[45] Date of Patent: Jan. 5, 1993

[54] FORMULATION OF ACTIVATING SUBSTRATE SURFACES FOR THEIR ELECTROLESS METALLIZATION

[75] Inventors: Günther Reichert; Henning Giesecke, both of Cologne; Gerhard D. Wolf, Dormagen, all of Fed. Rep. of Germany

[73] Assignee: Bayer Aktiengesellschaft, Leverkusen, Fed. Rep. of Germany

[21] Appl. No.: 696,431

[22] Filed: May 6, 1991

[30] Foreign Application Priority Data

May 16, 1990 [DE] Fed. Rep. of Germany ....... 4015717

[51] Int. Cl.⁵ .................................................. C09D 5/00
[52] U.S. Cl. .................................. 106/1.11; 106/1.21; 106/287.24; 427/304
[58] Field of Search ................. 106/1.11, 1.21, 287.24; 427/304

[56] References Cited

U.S. PATENT DOCUMENTS 3,560,257  2/1971  Schaeble, Jr. et al. ............ 106/1.28
3,900,320  8/1975  Rolker et al. ...................... 106/1.11

Primary Examiner—Mark L. Bell
Assistant Examiner—Deborah Jones
Attorney, Agent, or Firm—Sprung Horn Kramer & Woods

[57] ABSTRACT

Formulations containing an organometallic activator, a filler, a special mixture of organic solvents and a PU elastomer are eminently suitable for activating plastic surfaces for their electroless metallization avoiding stress-corrosion cracking.

The plastic parts so activated are preferably used for screening from electromagnetic waves after metallization has been carried out.

6 Claims, No Drawings

FORMULATION OF ACTIVATING SUBSTRATE SURFACES FOR THEIR ELECTROLESS METALLIZATION

BACKGROUND OF THE INVENTION

It is generally known that polymeric materials have to be pretreated before chemical metallisation, for example by etching the polymer surface with chromosulphuric acids. This method is, however, applicable only to those polymers whose surface can be altered oxidatively with the formation of cavities and vacuoles.

It is furthermore known that working with chromosulphuric acid, $SO_3$, vapor or other oxidants is accompanied by a deterioration of the physical properties such as the notched impact strength and the electrical surface resistance of the polymeric material. In addition, traces of hexavalent chromium, which rapidly result in poisoning of the metal baths, are often troublesome.

The known methods of electrolessly metallising materials comprise, however, several process steps and have the disadvantage that they are not directly applicable to all polymers. Often a chemical or physical roughening has to be carried out.

It has therefore already been proposed to activate the polymer surfaces very mildly with organometallic catalysts (cf. for example, U.S. Pat. No. 3,560,257 and EP-A 81,129). However, this method, which is very elegant per se, is not universally applicable either. In addition, the use of solvents frequently results in the initiation of stress-corrosion cracking of the polymer injection moulding which is under tensile or compressive stress.

Other methods such as those described in U.S. Pat. Nos. 3,560,257 and 4,017,265, and also DE-A 3,627,256 have the disadvantage that they require relatively large amounts of expensive noble-metal activators.

SUMMARY OF THE INVENTION

Surprisingly, it has now been found that well adhering metal layers can be produced on plastic surfaces without the disadvantages mentioned, in particular avoiding stress-corrosion cracking, if such surfaces are treated without prior pickling with an activator formulation based on organic noble-metal compounds, fillers, organic solvent mixtures and polyurethane elastomers as binders, a mixture of glycol ether acetates, aliphatic ketones and aliphatic alcohols being used as solvent mixture.

DETAILED DESCRIPTION OF THE INVENTION

Preferred formulations contain:
a) 0.03 to 3.0% by weight of an organic noble-metal compound as activator,
b) 20 to 60% by weight of glycol ether acetates,
c) 20 to 60% by weight of aliphatic ketones,
d) 4 to 60% by weight of aliphatic alcohols,
e) 0.5 to 3.0% by weight of fillers,
f) 4 to 20% by weight of polyurethane elastomers as binders,
the sum of the components a) to f) having to be 100% by weight.

After activation, metallisation is carried out in the conventional way.

It is surprising that the formulations according to the invention avoid stress-corrosion cracking on various plastics and at the same time bring about an adhesive metallisation, since on surfaces which have been treated only with a solvent, either immediate crack formation occurs in the plastic or, although the crack formation fails to appear in the case of solvent-sensitive plastics, no adhesive metallisation or an uneven metallisation takes place owing to an uneven film formation.

Preferred spray activator formulations therefore contain a solvent mixture composed of:
30–60% by weight of glycol ether acetates,
30–60% by weight of aliphatic ketones,
4–40% by weight of aliphatic alcohols In the context of the invention, glycol ether acetates are understood as meaning reaction products of ethylene glycol or propylene glycol with aliphatic alcohols and acetic acid such as, for example ethylene glycol ethyl ether acetate, propylene glycol methyl ether acetate and propylene glycol ethyl ether acetate.

The preferred aliphatic ketones used are straight-chain, branched or cyclic ketones containing 3 to 7 carbon atoms such as, for example, methyl ethyl ketone, methyl isobutyl ketone or cyclohexanone.

Suitable aliphatic alcohols are straight-chain or branched alcohols containing 2 to 8 carbon atoms such as ethanol, n-propanol, isopropanol, n-butanol or isobutanol which are optionally substituted by a keto group such as, for example diacetone alcohol.

Suitable activators in the formulations according to the invention are organometallic compounds of the 1st and 8th subgroups of the periodic system (in particular, Pd, Pt, Au, Ag) such as those described, for example, in EP-A 34,485, 81,438, 131,198. Particularly suitable are organometallic complex compounds of palladium with olefins (dienes), with $\alpha,\beta$-unsaturated carbonyl compounds, with crown ethers and with nitriles. Very particularly suitable are bisacetonitrilepalladium dichloride, butadienepalladium dichloride, 4-cyclohexane-1,2-dicarboxylic anhydride palladium dichloride, mesityl oxide palladium dichloride, 3-hepten-2-one-palladium chloride and 5-methyl-3-hexan-2-one-palladium chloride. Mixtures of these compounds may also be used.

Suitable fillers are auxiliaries known from the printing and lacquering technology such as pigments, disperse silicic acids, carbon blacks, silicates, rheological additives and clay minerals.

The binders according to the invention are known from polyurethane chemistry. They are prepared, for example, by reacting polyesters and/or polyethers with aromatic polyisocyanates and a chain extender, for example a low-molecular-weight diol such as, for example, butanediol or neopentyl glycol.

To prepare a storable, sprayable and toxicologically safe formulation, it is advantageous to use polyurethanes which no longer contain any free isocyanate groups.

Linear, aromatic polyurethane elastomers such as those prepared, for example, from butanediol polyadipate, neopentyl glycol and 4,4,'-diphenylmethane diisocyanate have proved particularly suitable.

Other binders such as, for example, polyacrylate polyols, polyester diols and polyether diols may also be used.

In addition to the activators, fillers, binders and solvent mixtures, the formulations optionally contain surfactants, leveling agents, dyestuffs and/or diluents such as, for example, xylene, toluene or n-butyl acetate. The formulations according to the invention are prepared, in general, by mixing the constituents. The formulation components can also be incorporated in separate steps.

For example, the activator may first be pre-dissolved or dispersed in a solvent component of the total formulation, for example in ketones, and then the filler, for example Aerosil ® added.

In a second step, this preparation is stirred into or dispersed in the remaining solvent mixture which contains the binder.

Preferably, surfaces may be activated for the purpose of an adhesive chemical metallisation by spraying on the formulations according to the invention by means of methods known from the paint, varnish and lacquer industry. Of course, the spraying-on of the formulations may be replaced by immersion, brushing on or rolling on.

Suitable substrates for the method according to the invention are paper, enamel, ceramic, polyethylene, polypropylene, epoxy resins, polyesters, polycarbonates, polyamides, polyimides, polyhydantoines, ABS plastics, silicones, polyvinyl halides and polyvinylidene fluoride in the form of sheets, plates, papers and nonwoven fabrics. Particularly preferred are substrates such as those used in the electronic industry as housings, for example ABS and polycarbonate plastics or their blends, polyphenylene sulphide, polybutylene terephthalate and their blends, and polypropylene oxide.

After applying the formulations according to the invention to the surface, for example the inside of a housing, the solvents are removed. This is done by drying or heat-treating at substrate-specific temperatures, for example between room temperature and 240° C. under normal pressure, elevated pressure or vacuum. The drying time may be varied in this process.

The surfaces so treated have then to be activated by reduction, for example by reducing agents such as formaldehyde, hypophosphite, rongalite and boranes.

A form of the method preferably carried out is to carry out the reduction in the metallisation bath immediately using the reducing agent of the electroless metallisation. This applies, for example to nickel and copper baths.

The surfaces treated with the formulations according to the invention can be metallised electrolessly in a further process step. The metallisation baths suitable for this purpose are known in the electroless metallisation technology.

The formulations according to the invention are particularly suitable for the partial activation of geometrically complicated surfaces, particularly for producing mouldings metallised on one or both sides or of housing parts metallised on the inside for the electronic industry for the purpose of electromagnetic screening. Structured metal surfaces can, of course, also be produced by this method by means of a suitable mask.

In the case of the products in the examples below characterized with the letter "®", registered trademarks are involved.

EXAMPLE 1

An unreactive polyurethane elastomer was prepared from butanediol polyadipate (MG 2000), neopentyl glycol and 4,4,'-diphenylmethane diisocyanate and introduced into the following activator formulation:
0.5 g of bisacetonitrilepalladium dichloride,
500 ml of methoxypropyl acetate (MPA),
450 ml of methyl ethyl ketone (MEK),
50 ml of n-butanol,
23 g of Aerosil" 380 (380 m²/g according to BET),
75 g of polyurethane.

The formulation was prepared in such a manner that the polyurethane was introduced in MPA, methyl ethyl ketone and n-butanol were added, then bisacetonitrilepalladium chloride was stirred in and, finally, Aerosil ® 380 was stirred in.

The spray activator formulation so prepared was sprayed on to injection-moulded test plates (100×150 mm) without stress-corrosion cracking by means of an air-assisted spray gun. The spraying distance was approximately 40 cm; the nozzle cross section was 1.5 mm; it was possible to vary the air feed (2 to 6 bar).

A blend of ABS polymer (acrylonitrile/butadiene/styrene copolymer) and a polyester of 4,4,-dihydroxydiphenyl-2,2-propane and carbonic acid was used as test plate substrate.

The sprayed test plates, which were free of stress-corrosion cracking, were dried for 1 h in air and then heat-treated for 1 h in a drying oven at 70° C. The test plates which had been cooled to room temperature were then immersed for 3h at 20° C. in a commercial Cu metallisation bath having the following concentrations: Cu =3.3 g/l; sodium hydroxide =5.4 g/l and formaldehyde =9.2 g/l, which was also used in the subsequent example. The copper was deposited uniformly. A metal coating with a continuous surface was produced.

The metallised test plates were then removed from the metal bath and thoroughly rinsed with demineralized water and heat-treated for 1 h in a drying oven.

To measure the adhesive strength of the metal layer in accordance with DIN 53 494, the test plates were provided with an electrolytically deposited Cu layer.

The adhesive strength in accordance with DIN 53 494 was: 15 N/25 mm.

EXAMPLE 2

The spray activator formulation was prepared as in Example 1.

The formulation was sprayed on to an injection-moulded test plate (100×150 mm) composed of a polycarbonate of 4,4,'-dihydroxydiphenyl-2,2-propane and carbonic acid without stress-corrosion cracking by means of an air-assisted spray gun, the plates were heat-treated for 1 h at 100° C. after drying, metallised in a metal bath for 1 h at 20° C. and then heat-treated for 1 h at 100° C. A coherent metal layer was obtained.

Adhesive strength in accordance with DIN 53 494: 10 N/25 mm.

EXAMPLE 3

The spray activator formulation was prepared and the method carried out as in Example 1. An ABS polymer (acrylonitrile/butadiene/styrene copolymer) was used as substrate.

The adhesive strength of the metal coating was 8N/25 mm.

EXAMPLE 4

The spray formulation was prepared as in Example 1 from the following components:
2.8 g of bisacetonitrilepalladium dichloride,
600 ml of MPA,
300 ml of MEK,
100 ml of n-butanol,
23 g of Aerosil ® 380 (380 m²/g according to BET),
75 g of polyurethane.

The formulation so prepared was sprayed on to a test plate composed of a blend of ABS polymer (acrylonitrile/butadiene/styrene copolymer) and a polycarbonate of 4,4'-dihydroxydiphenyl-2,2-propane and carbonic acid without stress-corrosion cracking, then heat-treated for 1 h at 70° C., treated for 3 h at 20° C. in an electroless Cu bath, thoroughly rinsed with water and heat-treated for 1 h at 70° C. in a drying oven.

Adhesive strength in accordance with DIN 53 494: 17 N/25 mm.

EXAMPLE 5

The spray activator formulation was prepared from the following components:
2.8 g of bisacetonitrilepalladium dichloride,
300 ml of MPA,
600 ml of MEK,
100 ml of n-butanol,
23 g of Aerosil ® 380 (380 m²/g according to BET],
75 g of polyurethane.

The preparation of the formulation and the procedure were carried out as in Example 4. A blend of ABS polymer (acrylonitrile/butadiene/styrene copolymer) and a polycarbonate of 4,4,'-dihydroxydiphenyl-2,2-propane and carbonic acid was used as test plate.

Adhesive strength in accordance with DIN 53 494: 5 N/25 mm.

EXAMPLE 6

The spray activator formulation was prepared from the following components:
2.8 g of bisacetonitrilepalladium dichloride,
600 ml of MPA,
300 ml of MEK,
100 ml of isopropanol,
23 g of Aerosil ® 380 (380 mz/g according to BET),
75 g of polyurethane.

The preparation of the formulation and the procedure were carried out as in Example 4. A blend of ABS polymer (acrylonitrile/butadiene/styrene copolymer) and a polycarbonate of 4,4,'-dihydroxydiphenyl-2,2-propane and carbonic acid was used as test plate.

Adhesive strength in accordance with DIN 53 494: 15 N/25 mm.

EXAMPLE 7

The spray activator formulation was prepared from the following components:
2.8 g of bisacetonitrilepalladium dichloride,
600 ml of MPA,
300 ml of MEK,
100 ml of n-butanol,
23 g of Aerosil" 380 (380 m²/g according to BET),
75 g of polyurethane.

The formulation was sprayed on to test plates composed of a polycarbonate of 4,4'-dihydroxydiphenyl-2,2-propane and carbonic acid, then heat-treated for 1 h at 100° C., metallised for 3 h at 20° C., thoroughly rinsed with water and heat-treated for 1 h in a drying oven at 100° C. The chemical Cu layer covered the entire surface and was without cracks.

Adhesive strength in accordance with DIN 53 494: 7 N/25 mm.

EXAMPLE 8

The spray activator formulation was prepared from the following components:
2 g of bisacetonitrilepalladium dichloride,
330 ml of MPA,
300 ml of MEK,
200 ml of isopropanol,
200 ml of diacetone alcohol,
15 g of Aerosil ® 380 (380 m²/g according to BET),
75 g of polyurethane.

The formulation was sprayed on to polycarbonate test plates produced from a polycarbonate of 4,4'-dihydroxydiphenyl-2,2-propane and carbonic acid. Then the test plates were heat-treated for 1 h at 100° C., metallised for 2 h at 24° C. in a metallisation bath and thoroughly rinsed with water. A metal layer was obtained. Heat treatment was then carried out for a further 1 h at 100° C.

Adhesive strength in accordance with DIN 53 494: 12 N/25 mm.

EXAMPLE 9

The spray activator formulation was prepared as in Example 8. A blend of ABS polymer (acrylonitrile/butadiene/styrene copolymer, and a polycarbonate of 4,4,'-dihydroxydiphenyl-2,2-propane and carbonic acid was used as substrate.

After spraying the formulation on to test plates, heat treatment was carried out for 1 h at 70° C. then metallisation was carried out for 2 h at 24° C. in a metallisation bath and thorough rinsing was carried out with water. A coherent metal layer was obtained. Heat treatment was then carried out for a further 1 h at 70° C.

Adhesive strength in accordance with DIN 53 494: 14 N/25 mm.

EXAMPLE 10

The spray activator formulation was prepared from the following components:
2 g of bisacetonitrilepalladium dichloride,
330 ml of MPA,
350 ml of MEK,
350 ml of diacetone alcohol,
15 g of Aerosil ® 380 (380 m²/g according to BET),
75 g of polyurethane.

The formulation was sprayed on to polycarbonate test plates produced from a polycarbonate of a polycarbonate of 4,4,'-dihydroxydiphenyl-2,2-propane and carbonic acid. The plates were then heat-treated for 1 h at 100° C., metallised for 2 h at 24° C. in a metallisation bath and thoroughly rinsed with water. A metal layer was obtained. Heat-treatment was then carried out for a further 1 h at 100° C.

Adhesive strength in accordance with DIN 53 494: 13 N/25 mm.

EXAMPLE 11

The spray activator formulation was prepared as in Example 10.

A polymer blend as in Example 9 was used as substrate.

After spraying the formulation on to test plates, heat-treatment was carried out for 1 h at 70° C., metallisation was then carried out for 2 h at 24° C. in a metallisation bath and thorough rinsing was carried out with water. A metal layer was obtained. Heat treatment was then carried out for 1 h at 70° C.

Adhesive strength in accordance with DIN 53 494: 12 N/25 mm .

EXAMPLE 12

The spray activator formulation was prepared from the following components:
2.2 g of bisacetonitrilepalladium dichloride,
185 ml of MPA, 175 ml of MEK,
175 ml of 2-butoxyethanol,
15 g of Aerosil ® 380 (380 m²/g according to BET),
37 g of polyurethane.

Calcium carbonate was added to the formulation last, but may also be added at other points in the preparation of the formulation.

The formulation was sprayed on to polycarbonate test plates as in Example 8. The plates were then heat-treated for 1 h at 100° C., metallised for 2 h at 24° C. in a copper bath and thoroughly rinsed with water.

A metal layer was obtained. Heat treatment was then carried out for a further 1 h at 100° C.

Adhesive strength in accordance with DIN 53 494: 10 N/25 mm.

EXAMPLE 13

The spray activator formulation was prepared as in Example 12.

A blend of ABS polymer and a polyester was used as substrate as in Example 9.

After spraying the formulation on to test plates, heat treatment was carried out for 1 h at 70° C., metallisation was then carried out for 2 h at 24° C. in a metallisation bath and thorough rinsing with water was carried out. A metal layer was obtained. Heat treatment was then carried out for a further 1 h at 70° C.

Adhesive strength in accordance with DIN 53 494: 7 N/25 mm

EXAMPLE 14

The spray activator formulation was prepared from the following components:
2.2 g of bisacetonitrilepalladium dichloride, 185 ml of MPA,
175 ml of MEK,
175 ml of diacetone alcohol,
15 g of Aerosil ® 380 (380 m²/g according to BET),
37 g of polyurethane.

Calcium carbonate was added to the formulation last, but may also be added at another point in the preparation of the formulation.

The formulation was sprayed on to polycarbonate test plates as in Example 8. Heat treatment was then carried out for 1 h at 100° C., metallisation was carried out for 2 h at 24° C. in a metallisation bath and thorough rinsing was carried out with water. A metal layer was obtained. Heat treatment was then carried out for a further 1 h at 100° C.

Adhesive strength in accordance with DIN 53 494: 10 N/25 mm .

EXAMPLE 15

The spray activator formulation was prepared as in Example 14.

A blend of ABS polymer and a polyester was used as substrate as in Example 9.

After spraying the formulation on to test plates, heat treatment was carried out for 1 h at 70° C., then metallisation was carried out for 2 h at 24° C. in a metallisation bath and thorough rinsing with water was carried out. A metal layer was obtained. Heat treatment was then carried out for a further 1 h at 70° C.

Adhesive strength in accordance with DIN 53 494: 14 N/25 mm.

What we claim is:

1. An activator formulation for activating substrate surfaces for their electroless metallization comprising (a) from 0.03 to 3.0% by weight of one or more organic noble-metal compounds as activator in admixture with (b) from 0.5 to 3.0% by weight of one or more fillers, an organic solvent mixture of (c) from 20 to 60% by weight of one or more glycol ether acetates, (d) from 20 to 60% by weight of one or more aliphatic ketones and (e) from 4 to 60% by weight of one or more aliphatic alcohols; and (f) from 4 to 20% by weight of one or more polyurethane elastomers; the sum of components (a) through (f) being 100% by weight.

2. An activator formulation in accordance with claim 1, wherein said one or more aliphatic ketones is methyl ethyl ketone and said glycol ether acetate is methoxypropyl acetate.

3. An activator formulation according to claim 1, wherein said organic noble-metal compounds are organometallic palladium compounds.

4. An activator formulation according to claim 1, wherein the polyurethane elastomers are the reaction products of a polyester having terminal OH groups, a polyisocyanate and a chain extender.

5. In a method for activating substrate surfaces for their electroless metallization, the improvement wherein said surfaces are first treated by applying a formulation comprising (a) from 0.03 to 3.0% by weight of one or more organic noble-metal compounds as activator in admixture with (b) from 0.5 to 3.0% by weight of one or more fillers, an organic solvent mixture of (c) from 20 to 60% by weight of one or more glycol ether acetates, (d) from 20 to 60% by weight of one or more aliphatic ketones and (e) from 4 to 60% weight of one or more aliphatic alcohols; and (f) from 4 to 20% by weight of one or more polyurethane elastomers; the sum of components (a) through (f) being 100% by weight.

6. In a method for preparing molding or housing parts metallized on one or both sides by activation and electroless metallization, the improvement comprising treating the surface or surfaces to be metallized by applying a formulation comprising from 0.03 to 3.0% by weight of one or more organic noble-metal compounds as activator in admixture with (b) from 0.5 to 3.0% by weight of one or more fillers, an organic solvent mixture of (c) from 20 to 60% by weight of one or more glycol ether acetates, (d) from 20 to 60% by weight of one or more aliphatic ketones and (e) from 4 to 60% by weight of one or more aliphatic alcohols; and (f) from 4 to 20% by weight of one or more polyurethane elastomers; the sum of components (a) through (f) being 100% by weight prior to heat-treating, reduction and treatment in an electroless metallization bath.

* * * * *

UNITED STATES PATENT AND TRADEMARK OFFICE
CERTIFICATE OF CORRECTION

PATENT NO. : 5,176,743

DATED : January 5, 1993

INVENTOR(S) : Reichert et al.

It is certified that error appears in the above-identified patent and that said Letters Patent is hereby corrected as shown below:

Col. 8, line 48   After " comprising " insert -- (a) --

Signed and Sealed this

Seventh Day of June, 1994

Attest:

BRUCE LEHMAN

*Attesting Officer*     *Commissioner of Patents and Trademarks*